(12) United States Patent
Estes et al.

(10) Patent No.: US 6,219,911 B1
(45) Date of Patent: Apr. 24, 2001

(54) FLIP CHIP MOUNTING TECHNIQUE

(75) Inventors: Richard H. Estes, Hollis, NH (US); Koji Ito; Masanori Akita, both of Otsu (JP); Toshihiro Mori, Moriyama (JP)

(73) Assignees: Polymer Flip Chip Corp., Billerica, MA (US); Toray Engineering Co., Tokyo (JP)

( * ) Notice: Subject to any disclaimer, the term of this patent is extended or adjusted under 35 U.S.C. 154(b) by 0 days.

(21) Appl. No.: 09/274,748

(22) Filed: Mar. 23, 1999

(30) Foreign Application Priority Data

Mar. 23, 1998 (JP) .................................................. 10-095463

(51) Int. Cl.⁷ ..................................................... H05K 3/34
(52) U.S. Cl. ................................ 29/840; 29/740; 29/840; 29/846; 29/877; 29/878
(58) Field of Search .............................. 29/740, 840, 846, 29/877, 878

(56) References Cited

U.S. PATENT DOCUMENTS

| 4,157,932 | 6/1979 | Hirata | 156/310 |
|---|---|---|---|
| 4,554,033 | 11/1985 | Dery et al. | 156/52 |

(List continued on next page.)

FOREIGN PATENT DOCUMENTS

| 0303256 | 2/1989 | (EP) | H01L/21/60 |
|---|---|---|---|
| 0360971 | 4/1990 | (EP) | H05K/1/18 |
| 0620701 | 10/1994 | (EP) | H05K/3/40 |
| 60-1849 | 1/1985 | (JP) | H01L/23/32 |
| 63-122133 | 5/1988 | (JP) | H01L/21/60 |
| 2054945 | 2/1990 | (JP) | H01L/21/60 |
| 2155257 | 6/1990 | (JP) | H01L/23/29 |
| 0316147 | 1/1991 | (JP) | H01L/21/60 |
| 0669278 | 3/1994 | (JP) | H01L/21/60 |
| 8236578 | 9/1996 | (JP) | H01L/21/60 |
| 0997815 | 4/1997 | (JP) | H01L/21/60 |
| 10-199932 | 7/1998 | (JP) | H01L/21/60 |
| 10199932 | 7/1998 | (JP) | H01L/21/60 |
| 9904430 | 1/1999 | (WO) | H01L/23/48 |
| 9949507 | 9/1999 | (WO) | H01L/21/60 |

OTHER PUBLICATIONS

Estes, "Fabrication and Assembly Processes for Solderless Flip Chip Assemblies," Proc., 1992.

Int. Society For Hybrid Microelectronics Conf., pp. 322–335, San Fran., CA, Oct. 19–21, 1992.

Kulesza et al., "Solderless Flip Chip Technology," *Hybrid Circuit Technology*, Feb. 1992.

"Wafer Surface Protection Achieved with Screen Printable Polyimide," Industry News, *Semiconductor International*, Jun. 1987.

EPO–TEK® 600, Epoxy Technology Product Specification, Jun. 1987.

(List continued on next page.)

*Primary Examiner*—Stephen F. Gerrity
*Assistant Examiner*—Paul D. Kim
(74) *Attorney, Agent, or Firm*—Theresa A. Lober

(57) ABSTRACT

In a flip chip bonding method, polymer bumps are formed, using a bonding tool, on an IC chip, held via suction to the bonding tool. An insulating adhesive film is pressed onto the upper surface of a circuit board held via suction with a suction stage. Heat is then applied to bring the film into close contact with bond pads of the circuit board. At this point, the bonding tool is moved downward, bonding the polymer bumps to the circuit board electrodes. During the time of this downward movement, bonding of the polymer bumps to the circuit board bond pads can be achieved by piercing the insulating adhesive film with the polymer bumps, and it is found that strong bonding can be achieved with adequate reliability. This method eliminates the need for a process in which through-holes must be pierced in the insulating adhesive film to accommodate the polymer bumps.

8 Claims, 2 Drawing Sheets

U.S. PATENT DOCUMENTS

| | | | |
|---|---|---|---|
| 4,612,083 | | 9/1986 | Yasumoto et al. .................. 156/633 |
| 4,640,981 | | 2/1987 | Dery et al. ......................... 174/88 R |
| 4,680,226 | * | 7/1987 | Takade et al. ....................... 29/832 |
| 4,749,120 | | 6/1988 | Hatada ................................. 228/123 |
| 4,818,728 | | 4/1989 | Rai et al. ............................. 437/209 |
| 4,868,979 | * | 9/1989 | Fukushima et al. ................. 29/840 |
| 4,917,466 | | 4/1990 | Nakamura et al. ................. 350/336 |
| 4,967,314 | | 10/1990 | Higgins, III ........................ 361/414 |
| 5,074,947 | * | 12/1991 | Estes et al. ...................... 156/307.3 |
| 5,086,558 | * | 2/1992 | Grube et al. ......................... 29/832 |
| 5,136,365 | | 8/1992 | Pennisi et al. ....................... 357/72 |
| 5,147,210 | * | 9/1992 | Patterson et al. ................... 439/91 |
| 5,196,371 | | 3/1993 | Kulesza et al. .................... 437/183 |
| 5,237,130 | * | 8/1993 | Kulesza et al. .................... 174/260 |
| 5,296,063 | | 3/1994 | Yamamura et al. .................. 156/64 |
| 5,298,279 | | 3/1994 | Hayashi ................................ 427/96 |
| 5,318,651 | | 6/1994 | Matsui et al. .................... 156/273.5 |
| 5,329,423 | | 7/1994 | Scholz ................................. 361/760 |
| 5,341,564 | | 8/1994 | Akhavain et al. .................... 29/832 |
| 5,363,277 | | 11/1994 | Tanaka ............................... 361/760 |
| 5,384,952 | * | 1/1995 | Matsui ................................. 29/840 |
| 5,477,419 | * | 12/1995 | Goodman et al. .................. 361/760 |
| 5,543,585 | | 8/1996 | Booth et al. ........................ 174/261 |
| 5,545,281 | * | 8/1996 | Matsui et al. .................... 156/273.7 |
| 5,611,140 | * | 3/1997 | Kulesza et al. ...................... 29/832 |
| 5,637,176 | | 6/1997 | Gilleo et al. ........................ 156/277 |
| 5,667,884 | | 9/1997 | Bolger ................................. 428/323 |
| 5,674,780 | | 10/1997 | Lytle et al. ......................... 437/183 |
| 5,686,702 | | 11/1997 | Ishida ................................. 174/250 |
| 5,714,252 | | 2/1998 | Hogerton et al. ................... 428/344 |
| 5,747,101 | | 5/1998 | Booth et al. .......................... 427/96 |
| 5,840,417 | | 11/1998 | Bolger ................................. 428/323 |
| 5,843,251 | * | 12/1998 | Tsukagoshi et al. ................. 156/64 |
| 5,861,678 | | 1/1999 | Schrock .............................. 257/783 |
| 5,879,761 | | 3/1999 | Kulesza et al. ..................... 427/555 |
| 5,918,364 | | 7/1999 | Kulesza et al. ....................... 29/832 |

OTHER PUBLICATIONS

EPO–TEK® H20E–PFC Electrically Conductive Silver Epoxy, Epoxy Technology Product Specification, Sep. 1992.

EPO–TEK® 688–PFC PFC Silicon Wafer Coating, Epoxy Technology Product Specification, Oct. 1992.

Kulesza et al., "A Screen–Printable Polyimide Coating for Silicon Wafers," *Solid State Technology*, Jan. 1988.

Kulesza et al., "A Better Bump. Polymers' Promise to Flip Chip Assembly," *Advanced Packaging*, pp. 26–29, vol. 6, No. 6, Nov./Dec. 1997.

Hatada et al., "A New LSI Bonding Technology 'Micron Bump Bonding Assembly Technology,'" *5$^{th}$ IEEE CHMT Int. Elect. Man. Tech. Symp.*, pp. 23–27, 1988.

* cited by examiner

FLIP CHIP MOUNTING TECHNIQUE

BACKGROUND OF THE INVENTION

This invention relates to flip chip mounting methods, and in particular relates to flip chip mounting techniques that employ an insulating, adhesive film.

Various methods of conventional flip chip mounting are known. One representative example is the flip chip mounting technique using an insulating adhesive film. As opposed to other flip chip mounting methods, this technique has features which enable simplification of the mounting process, like bonding of an integrated circuit (IC) chip to a substrate such as a circuit board, and underfilling around the bonding point with a resin sealant.

This mounting technique has attracted attention recently, and in 1997 Japanese Public Patent Report No. 97815, Paragraphs [0018] and [0020] disclose a mounting technique where gold (Au) bumps on the IC chip are directly bonded to substrate electrodes; this method is referred to hereinafter as direct mounting. Also, Paragraph [0014] describes a mounting technique where Au bumps on the IC chip are indirectly bonded to substrate electrodes; this method is referred to hereinafter as indirect mounting.

However, with indirect mounting, electrical bonding of an IC chip and a substrate is achieved via a conductive adhesive layer which fills through-holes in an insulating adhesive film placed on both the chip and the board. In the direct mounting method, on the other hand, a mediating electrically conductive adhesive layer is not used, and bonding is achieved by bringing the Au bumps of the IC chip into contact with electrodes of the circuit board by inserting the bumps into through-holes pierced in the insulating adhesive film. Thus the indirect method has the problem of lower reliability than the direct method, as well as susceptibility to conductivity defects.

Therefore, although priority is being placed on direct mounting even in this case, the insulating adhesive film must have in it many minute through-holes that were, e.g., pierced, to enable insertion of the Au bumps of the chip through the holes; the processing requiring this technique can be troublesome and the method lacks general applicability.

SUMMARY OF THE INVENTION

The present invention overcomes the problems and limitations of prior flip chip mounting methods by providing polymer bumps, formed of electrically conductive adhesive, instead of conventional bumps like solder bumps formed by, e.g., a ball bonding method, or Au bumps formed by, e.g., a plating method, as the bumps of an IC chip to be bonded to a substrate on which is provided an insulating adhesive film. With the use of polymer bumps, it has been discovered that satisfactory bonding can be achieved by piercing the polymer bumps through the insulating adhesive film to make electrical contact between the IC chip and the substrate.

More specifically, in a flip chip mounting method incorporating the invention, polymer bumps formed on bond pads of an IC are bonded directly to electrodes, i.e., bond pads, of a substrate, such as a circuit board, on which is provided an insulating adhesive film, by piercing the film with the bumps to directly contact the substrate bond pads, whereby the bumps make connection between the bond pads of the IC and the bond pads of the substrate. The insulating adhesive film thereby mediates between the upper IC chip and lower circuit board, as an underfill. The IC polymer bumps are preferably composed of electrically-conducting paste.

Preferably, the polymer bumps are formed by stenciling. Also preferably, prior to bonding of the IC to the substrate such as a circuit board, the insulating adhesive film is pressed against the substrate, with the application of heat employed to bring the film into close contact with the substrate electrodes; then the bump bonding is carried out. Preferably, the substrate is held with a suction stage; i.e., held by vacuum. It is preferred to employ a resin, i.e., polymeric, substrate in a technique wherein the board is employed with a suction stage. A thermally-curable insulating adhesive film is preferred.

Other features and advantages of the flip chip mounting method of the invention will be apparent from the following description and accompanying drawing, and from the claims.

DETAILED DESCRIPTION OF THE INVENTION

Figure 1:
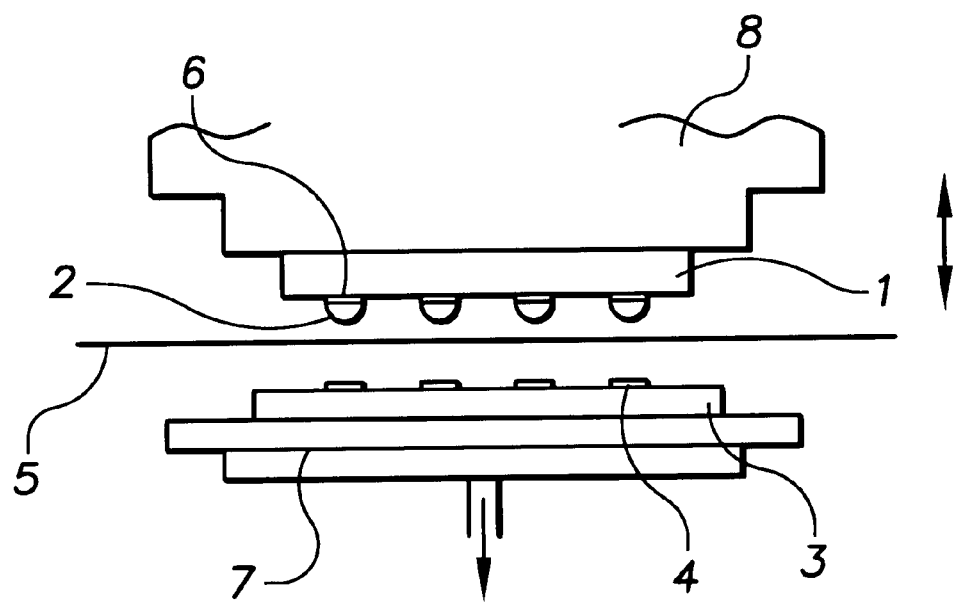
FIG. 1 is a schematic cross-sectional view of a flip chip being mounted to a substrate by a method in accordance with the invention.

As indicated in FIG. 1, with this invention, polymer bumps 2 of an IC chip 1 are directly bonded to the electrodes 4 of a substrate, such as a circuit board 3, with an insulating adhesive film 5 located between the IC chip 1 and the circuit board 3. The polymer bumps are formed by, e.g., stenciling electrically-conductive paste on the electrode pads 6, i.e., bond pads, of the IC chip 1. A metal mask is satisfactory as a plate material for this stenciling of the polymer bumps on the electrode pads.

Heat-curable resin paste, e.g., epoxy resin paste or other such resin paste, containing conductive particles, e.g., silver particles or other such material, can be used as the electrically-conductive paste. The insulating adhesive film 5 can be, e.g., a heat-curable material, a thermoplastic material, or a mixture of the two. The preferred alternative is that of a heat-curable insulating adhesive film. The form of this film is, e.g., a single sheet, but laminated films, or other films, can be used.

It is preferred that the circuit board 3 be a resin film, i.e., polymeric, board, but other types of substrates can be used. It is preferred that the board be held via suction, i.e., vacuum, on a suction stage 7. When the circuit board 3 is held via suction on a suction stage 7, it is best if the insulating adhesive film 5 is first set on the circuit board 3, with heat thereafter applied while pressing the film against the board 3. Bonding of the film to the substrate can then be accomplished after bringing the film into close contact with the electrodes 4 of the circuit board 3 using the suction in this way.

Applying heat, e.g., a heating temperature of about 80° C., while pressing the insulating adhesive film 5 against the circuit board 3 can be accomplished using a reserve heating tool, and then bonding of the flip chip to the substrate can be accomplished using a bonding tool 8. The bonding tool 8 is preferably mounted to enable movement of the tool in all three axis directions, X, Y, and Z, as well as rotation to a specified angle. Furthermore, the bonding tool preferably has a built-in heater (not indicated in the figure), and is set to enable vacuum suction holding of the IC chip 1 to the tool 8.

Figure 2:
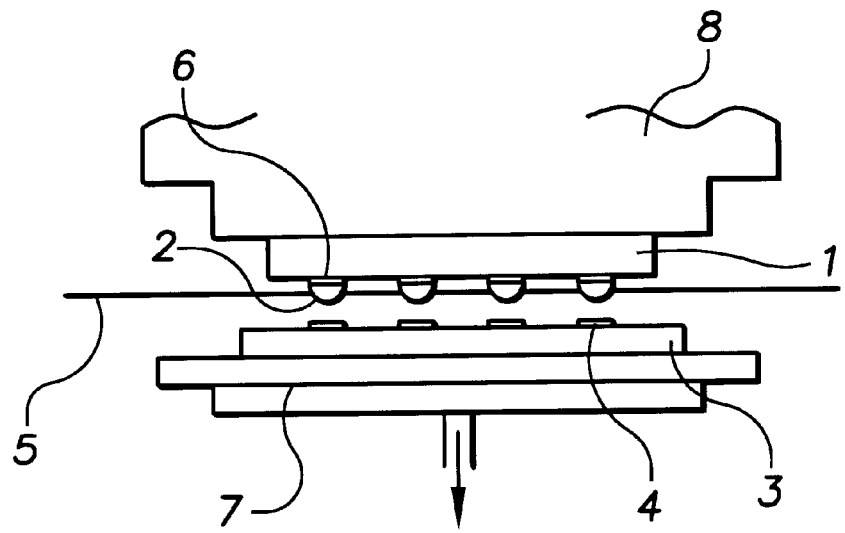
FIG. 2 is a schematic cross-sectional view of a process step, provided by the invention, in which polymer bumps of a flip chip pierce an insulating film provided on a substrate.
Figure 3:
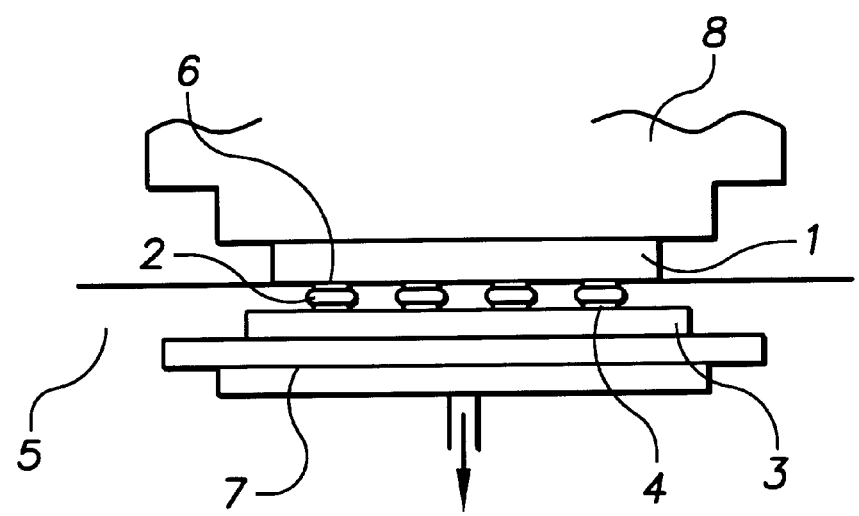
FIG. 3 is a schematic cross-sectional view of a process step, provided by the invention, in which polymer bumps of a flip chip are directly bonded to bond pads of a substrate.

Thereafter, heat-pressure attachment, i.e., bonding, is achieved by precisely positioning the polymer bumps 2 of the IC chip 1 on the electrodes 4 of the underlying circuit board. Bonding can be satisfactorily achieved by piercing through the insulating film 5 with the polymer bumps 2 of the IC chip 1 as shown in FIGS. 2 and 3. The heating temperature and the pressure for the bonding are preferably controlled to specified values.

Thus, in accordance with the invention, the IC chip 1 bumps are composed of polymer bumps 2 formed from electrically-conductive paste. Compared with other bumps, like solder bumps formed with a ball bonding method, or Au bumps formed with a plating method, these polymer bumps 2 likewise successfully enable piercing of the insulating film. The polymer bumps differ greatly from the solder bumps or Au bumps, however, in that during the bonding process the polymer bumps can deform to expand across the contact area of the electrodes 4 of the circuit board 3. In addition, the polymer bumps have the characteristic that in the state where the bump surface is suitable for bonding, the silver particles deposited on the surface of the bump form minute concave and convex surface regions. There is also a notable difference in that, during bonding, the bump resin paste plays the role of an adhesive.

Therefore, even though minute through-holes are not provided in the insulating adhesive film 5 for inserting the polymer bumps 2 of the IC chip 1, direct bonding can be achieved by piercing the film as shown in FIGS. 2 and 3. The method thus makes the preparation of the insulating adhesive film 5 easier, thereby greatly improving the general applicability of the technique. Also, in this case strong bonding can be achieved with adequate reliability.

EXAMPLE

Paste bumps were formed on the electrode pads of an IC chip using a stenciling method with an electrically-conductive paste formed of a heat-curable epoxy resin containing between about 60%–80% silver particles. An Ni/Au metal film was formed beforehand on the aluminum electrode pads using a non-electrolytic plating method. The paste bump stenciling technique employed a metal mask with a mask thickness of about 50 $\mu$m and a mask hole diameter of about 95 $\mu$m.

A wafer of IC chips having the stenciled bumps thereon was heated for approximately 1 hour in an oven at about 150° C., thereby hardening, i.e., polymerizing, the bumps, to obtain a wafer with polymerized bumps of an average bottom diameter of about 150 $\mu$m and an average height of about 40 $\mu$m. At their peak, the bumps had a comparatively flat area of about 20 $\mu$m, but taken as a whole, the shape of each bump was that of a circular cone. Individual chips were created by cutting the wafer with a dicing saw. The number of bumps per single chip was 48.

With regard to the substrate, a copper wiring pattern was formed using a conventional etching method on a polyester substrate to which an 18 $\mu$m-thick copper foil was affixed. A metal layer of Ni/Au was formed on the copper wiring using a non-electrolytic plating method.

Next a film formed of half-cured, i.e., B-staged, heat-curable epoxy resin was cut to a size slightly larger than the IC chip, and was affixed to the specified bonding position of the circuit board by heating to about 80° C. with a heating tool.

Next, alignment marks on the circuit board and an alignment pattern on the IC chip were aligned using two microscopes, an upper scope and a lower scope, and the IC chip was pressed against the circuit board using a bonding tool heated to about 210° C., with the application of a force of about 2.5 Kg. After 20 seconds elapsed, the bonding tool was cooled with air for 5 seconds, and then bonding was finished by raising the tool.

When the bump tip section of the bonded IC chip was observed, there was found a deformation of the bump and a corresponding decrease in bump height by about ⅓ in the bump height direction; the flat part of the bump at the bump tip was found to expand to a diameter of about 40 $\mu$m. The IC chip was strongly bonded to the specified position of the wiring conductor pattern on the circuit board, and there was no evidence of the mixture of air bubbles into the adhesive layer film in areas near to the bumps.

It is therefore found that as described above, it is possible to directly bond IC chip polymer bumps to circuit board electrodes using an insulating film with no through-holes. This condition facilitates preparation of the insulating adhesive film, and markedly improves the general applicability of the technique. It also enables strong bonding in a state with adequate reliability.

It is recognized, of course, that those skilled in the art may make various modifications and additions to the flip chip bonding techniques described above without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for mounting a flip chip on a substrate, comprising the steps of:
    forming an insulating adhesive film on a substrate having bond pads, covering the bond pads with the film;
    forming none metal slated electrically-conductive polymer bumps on bond pads of the flip chip;
    polymerizing the polymer bumps;
    directly bonding the polymerized bumps of the flip chip to the bond pads of the substrate by causing the polymerized bumps to break through the insulating adhesive film on the substrate.

2. The method of claim 1, wherein the polymer bumps are formed by stenciling.

3. The method of claim 1 wherein the step of forming an insulating adhesive film comprises heating the film while pressing the film onto the substrate, to bond the film to the substrate, after bringing the film into close contact with bond pads of the substrate.

4. The method of claim 1 wherein the step of bonding the polymerized flip chip bumps to the substrate bond pads comprises holding the substrate with a vacuum.

5. The method of claim 4 wherein the substrate comprises a polymeric substrate.

6. The method of claim 1 wherein the insulating adhesive film comprises a heat-curable film.

7. The method of claim 1 wherein the electrically-conductive polymer bumps comprise heat-curable epoxy resin and silver particles.

8. The method of claim 1 wherein the step of directly bonding the polymerized bumps comprises heating the flip chip under pressure as the polymerized bumps break through the insulating adhesive film on the substrate.

* * * * *

UNITED STATES PATENT AND TRADEMARK OFFICE
CERTIFICATE OF CORRECTION

PATENT NO. : 6,219,911 B1
DATED : April 24, 2001
INVENTOR(S) : Richard H. Estes, Koji Ito, Masanori Akita, and Toshihiro Mori It is certified that error appears in the above-identified patent and that said Letters Patent is hereby corrected as shown below:

Column 4,
Line 38, "none metal slated" should read -- non-metal plated --.

Signed and Sealed this

Twenty-eighth Day of August, 2001

*Attest:*

*Attesting Officer*

NICHOLAS P. GODICI
*Acting Director of the United States Patent and Trademark Office*